United States Patent
Candela et al.

(10) Patent No.: US 10,962,584 B2
(45) Date of Patent: Mar. 30, 2021

(54) PROCESSING APPARATUS AND METHOD FOR DETECTING PARTIAL DISCHARGE PULSES IN THE PRESENCE OF NOISE SIGNALS

(71) Applicant: PRYSMIAN S.P.A., Milan (IT)

(72) Inventors: Roberto Candela, Milan (IT); Antonio Di Stefano, Milan (IT); Giuseppe Fiscelli, Milan (IT)

(73) Assignee: PRYSMIAN S.P.A., Milan (IT)

( * ) Notice: Subject to any disclaimer, the term of this patent is extended or adjusted under 35 U.S.C. 154(b) by 249 days.

(21) Appl. No.: 16/079,384

(22) PCT Filed: Feb. 24, 2016

(86) PCT No.: PCT/EP2016/053841
§ 371 (c)(1),
(2) Date: Aug. 23, 2018

(87) PCT Pub. No.: WO2017/144091
PCT Pub. Date: Aug. 31, 2017

(65) Prior Publication Data
US 2019/0056447 A1 Feb. 21, 2019

(51) Int. Cl.
*G01R 31/12* (2020.01)
*G01R 31/08* (2020.01)

(52) U.S. Cl.
CPC ......... *G01R 31/1272* (2013.01); *G01R 31/08* (2013.01)

(58) Field of Classification Search
CPC .................................................. G01R 31/1272
See application file for complete search history.

(56) References Cited

U.S. PATENT DOCUMENTS 6,754,613 B2 * 6/2004 Tabatabaei .............. G04F 10/00
702/189
8,467,982 B2 6/2013 Serra et al.
(Continued)

FOREIGN PATENT DOCUMENTS

EP 1 094 324 A2 4/2001
EP 2 411 823 B1 6/2015
JP H01184474 A 7/1989

OTHER PUBLICATIONS

JP407229947A, "Measurement of partial discharge and method for locating its generation point", Miyazaki, et al., (1995).*

*Primary Examiner* — Hyun D Park
(74) *Attorney, Agent, or Firm* — Seed IP Law Group LLP

(57) ABSTRACT

It is described a processing apparatus (2) for detecting partial discharge pulses in the presence of noise signal, comprising: a first detector (3) configured to detect an electromagnetic impulsive signal ($P_{INT}$; $P_{EX2}$) from a first area (9) of an electrical object (1, 6) and generate a first electrical pulse ($P_1$) representing a first detection event of the electromagnetic impulsive signal; a second detector (4) configured to detect the electromagnetic impulsive signal from a second area (10) of the electrical object (1, 6) and generate a second electrical pulse ($P_2$) associated with a second detection event of the electromagnetic impulsive signal; a time calculation module (17) configured to measure a time interval ($T_{d1}$; $T_{d2}$) between the first detection event and the second detection event; and a processing module (18) connected to the time calculation module (17). The processing module (18) is configured to: compare the measured time interval ($T_{d1}$; $T_{d2}$) with a time threshold value ($TH_t$); associate the electromagnetic impulsive signal ($P_{INT}$) to partial discharge pulses generated inside the electrical object (1, 6) between the first and second areas (9, 10) if the measured time interval ($T_{d1}$) is lower than the time threshold (Continued)

value ($TH_t$); and associate the electromagnetic impulsive signal ($P_{EX2}$) to a noise signal generated outside the electrical object (1, 6) if the measured time interval ($T_{d2}$) is equal to or greater than said time threshold value ($TH_t$).

18 Claims, 6 Drawing Sheets

(56) References Cited

U.S. PATENT DOCUMENTS

| | | |
|---|---|---|
| 2004/0189317 A1 | 9/2004 | Borchert et al. |
| 2013/0191049 A1* | 7/2013 | Sales Casals .......... G01R 31/12 702/58 |

* cited by examiner

PROCESSING APPARATUS AND METHOD FOR DETECTING PARTIAL DISCHARGE PULSES IN THE PRESENCE OF NOISE SIGNALS

BACKGROUND

Technical Field

The present invention relates to a processing apparatus and method for recognising partial discharges in electrical components and systems, such as: medium or high voltage cables, cable joints, overhead line insulators, medium and high voltage switchboard boxes, high and extra-high voltage cables using GIS (Gas Insulated Switchgear) and other electrical apparatus where partial discharges can be observed.

Description of the Related Art

The term "partial discharges" (PD) is intended to indicate an undesired recombination of electric charges occurring in the dielectric (insulating) material of electric components, in the presence of defects of various types, eventually leading to dielectric destruction. Here, a pulse current is generated in portions of dielectric material and causes an electromagnetic impulsive signal to propagate through the power or ground cables of the relevant electric system, and radiating through the various surrounding media (dielectric material, metals, air, etc.).

According to the state of the art, PD measurement is carried out by employing a sensor connected or positioned near the component under test to detect pulse signals. The pulse signals collected by the sensor are acquired by an electronic device that usually comprises a high speed digital data acquisition stage and data storage module, communication and post-processing (analyzing) devices.

A difficulty in performing PD measures is to reliably discriminate between real PD pulses and external noise that is often composed by pulses very similar to the PD. According to one method, in Alternate Current (AC) systems, the detected pulses are correlated with the phase of the voltage powering the component under test: since real PDs originate mainly at specific phase intervals, it is possible to highlight them (noise instead tends to be equally scattered at every phase angles). This known technique, called "Phase Resolved PD Pattern" implies to measure and acquire the voltage phase angle (by using a dedicated sensor) along with the PD signal. The Phase Resolved PD Pattern method cannot be used in Direct Current (DC) systems where the voltage is constant and not sinusoidal, so there is not a phase reference to be detected.

Other methods employed to discriminate PD from noise are based on the analysis of the pulse waveforms, by means of feature extraction and clustering algorithms. These methods imply the acquisition of a large number or pulses (many of which are noise) with a very high sampling rate, so requiring complex and expensive hardware.

Document WO2013/185820 describes a partial discharge acquisition and analysis device structured to detect a synchronization signal representing the supply voltage phase angle and perform extraction of features of the pulses acquired by a sensor. The pulse features extracted according to this prior art documents are: peak value and polarity, phase, energy, duration and rough estimation of Weibull parameters.

Document EP2411823 discloses a method for locating partial discharges occurring at a discharge site in an electric apparatus with elongate geometry. The partial discharges are corresponding electric pulses propagating in opposite directions along the apparatus from the discharge site. Moreover, the method comprises: selecting, for the pair of correlated subsets, at least one pair of homologous pulses detected in different sensors in the same time interval; and calculating the distance between the discharge site and the sensors.

Document JPH01184474 refers to a technique for locating the position where partial discharge occurs without being affected by an external noise. The method is based on detecting an electric field pulse generated by the partial discharge of the cable to be measured by electric field optical sensors which are arranged at specific positions and locating the position of the partial discharge according to the level and arrival time difference of the signal propagating along an optical fibre connected with the optical sensors. Using a plurality of sensors placed along a cable the partial discharge occurrence position is found from the arrival time difference between one electric field optical sensor and another electric field optical sensor.

BRIEF SUMMARY OF THE INVENTION

The Applicant observes that the known partial discharge acquisition methods implement complex techniques to discriminate partial discharge pulses from external noise and, particularly, some of the prior art methods employable for discriminating noise in AC electrical systems cannot be used in DC electrical systems.

The Applicant found that the discrimination of partial discharge pulses generated inside a monitored electrical object from noise generated outside the monitored electrical object can be based on the measure of a time interval comprised between detection events occurred at two detectors placed at different areas of the electrical object.

According to a first aspect, the present invention relates to a processing apparatus for detecting partial discharge pulse in the presence of noise signal comprising:

a first detector configured to detect an electromagnetic impulsive signal from a first area of an electrical object and generate a first electrical pulse associated with a first detection event of the electromagnetic impulsive signal;

a second detector configured to detect the electromagnetic impulsive signal from a second area of the electrical object and generate a second electrical pulse associated with a second detection event of the electromagnetic impulsive signal;

a time calculation module configured to measure a time interval comprised between the first detection event and the second detection event;

a processing module connected to the time calculation module configured to:

compare the measured time interval with a time threshold value;

associate the electromagnetic impulsive signal to partial discharge pulses generated inside the electrical object between the first and second areas, if the measured time interval is lower than the time threshold value; and associate the electromagnetic impulsive signal to a noise signal generated outside the electrical object, if the measured time interval is equal to or greater than said time threshold value.

With the term "area" it is meant a zone or a point on the electrical object or close to the electrical object from which electromagnetic signals propagating inside the electrical object can be detected from outside.

According to an embodiment, the processing apparatus further comprises a first conversion device configured to receive the first electrical pulse and generate a first time signal at a first detection time;

a second conversion device configured to receive the second electrical pulse and generate a second time signal at a second detection time;

and the time calculation module is configured to measure the time interval comprised between the first and second detection times.

Preferably, said first conversion device includes a first voltage comparator structured to compare the first electrical pulse with a voltage threshold, and generate the first time signal assuming:

a first logical level if the voltage of the first electrical pulse is greater than the voltage threshold, and a second logical level if the voltage of the first electrical pulse is equal to or lower than the voltage threshold.

Preferably, the second conversion device includes a second voltage comparator structured to compare the second electrical pulse with the voltage threshold, and generate the second time signal assuming:

the first logical level if the voltage of the second electrical pulse is greater than the voltage threshold, and the second logical level if the voltage of the second electrical pulse is equal to or lower than the voltage threshold.

Particularly, said first and second voltage comparators are fast comparators.

Preferably, each of said first and second detectors includes one of the following sensor devices: High Frequency Current Transformer, capacitive coupler, antenna sensor, electromagnetic sensor. Particularly, each of said first and second detectors is an active electromagnetic sensor having a frequency response from 5 MHz to 20 MHz.

Advantageously, the processing module is configured to count a number of a plurality of electromagnetic impulsive signals having a corresponding measured time interval lower than the time threshold value and compare said number with a reference value.

Preferably, the time calculation module comprises a Time-to-Digital-Converter circuit and is configured to generate said time interval under the form of a digital value. Particularly, the Time-to-Digital-Converter circuit is configured to:

start computing of the time interval when the first time signal is received by the Time-to-Digital-Converter circuit;

stop computing of the time interval when the second time signal is received by the Time-to-Digital-Converter circuit.

According to an embodiment, the Time-to-Digital-Converter circuit comprises a first input port for receiving said first time signal and a second input port for receiving said second time signal. Advantageously, the Time-to-Digital-Converter circuit shows a time resolution comprised between 0.01 ns and 10 ns.

The processing apparatus further comprises a storage module connected to the processing module and configured to store a detection digital value representing that partial discharge pulses have been detected when the measured time interval is lower than the threshold value.

According to a second aspect the present invention relates to a processing method for detecting a partial discharge pulse in the presence of noise signal, the method comprising the steps of:

providing an electrical object to be monitored, detecting an electromagnetic impulsive signal from a first area of the electrical object and generating a corresponding first electrical pulse representing a first detection event of the electromagnetic impulsive signal;

detecting the electromagnetic impulsive signal from a second area of the electrical object and generating a second electrical pulse representing a second detection event of the electromagnetic impulsive signal;

measuring a time interval comprised between the first detection event and the second detection event;

comparing the measured time interval with a threshold value;

associating the electromagnetic impulsive signal to partial discharge pulses generated in the electrical object between the first and second areas if the measured time interval is lower than the threshold value; and associating the electromagnetic impulsive signal to a noise signal if the measured time interval is equal to or greater than the threshold value.

Advantageously, the partial discharge processing method further comprises:

converting the first electrical pulse into a first time signal representing a first detection time;

converting the second electrical pulse into a second time signal representing a second detection time;

and wherein the step of measuring the time interval comprises:

evaluating an interval comprised between the first and second detection times.

Preferably, the electrical object to be monitored comprises a Direct Current operating electrical object.

BRIEF DESCRIPTION OF THE DRAWINGS

Further characteristics and advantages will be more apparent from the following description of preferred embodiments given by way of example, with reference to the enclosed drawings in which.

DETAILED DESCRIPTION

Figure 1:
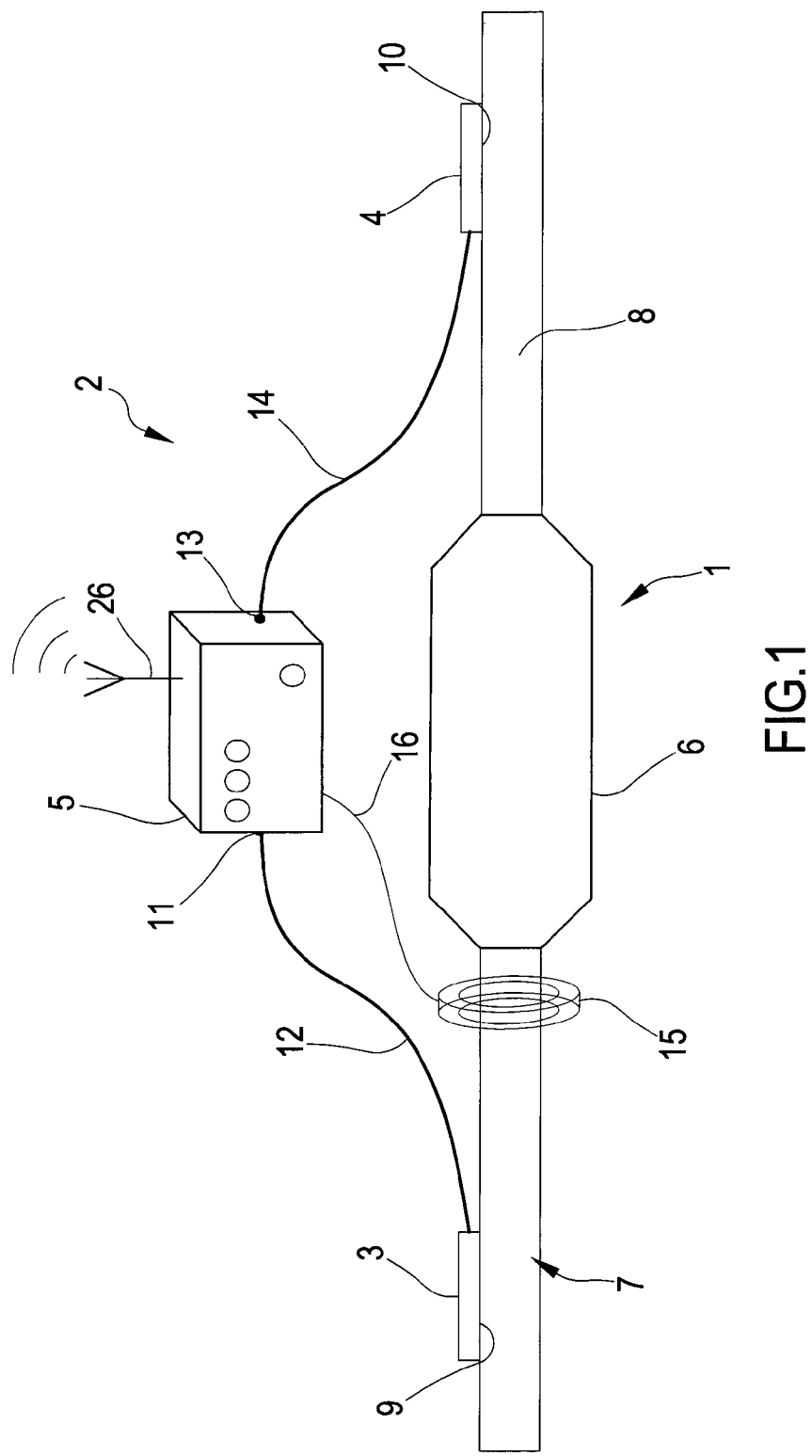
FIG. 1 shows an embodiment of a partial discharge detection apparatus employable to monitor an electrical object.

FIG. 1 shows an electrical object 1 and a partial discharge detection apparatus 2 comprising a first detector 3, a second detector 4 and a signal processing module 5. The electrical object 1 can be a component, device, apparatus or system which can produce partial discharge electromagnetic pulses and is, as an example: a medium or high voltage cable, a cable joint, an overhead line insulator, a medium or high voltage switchboard box, a high and extra-high voltage cable using GIS (Gas Insulated Switchgear), an electric motor, an electric generator or a medium or high voltage transformer or the like. The electrical object 1 can be either an AC or a DC electrical object. In accordance with the particular example shown in FIG. 1 the electrical object 1 is a cable joint 6 which joins a first cable 7 with a second cable 8. The first and second cables 7, 8 can be, as an example, HVAC (High Voltage Alternate Current) cables.

The partial discharge detection apparatus 2 is structured to monitor the status of the cable joint 6 by detecting partial discharge pulses and discriminating them from electrical pulses due to external noise. The external noise can be any signal, either due or not due to partial discharge phenomena, generated in the environment external to the electrical object 1 or generated inside the electrical object 1 but outside a measuring section including the monitored cable joint 6.

The first detector 3 and the second detector 4 are configured to detect electromagnetic pulses and generate corresponding electric signals to be provided to the signal processing module 5. Each one of the first detector 3 and the second detector 4 can be or can include a corresponding sensor configured to convert electromagnetic pulses into electrical pulses. The first and second detectors 3 and 4 can be passive sensors or, preferably, active sensors, e.g. sensors provided with an active local electronic amplifier.

Particularly, the first detector 3 and/or the second detector 4 can be one of the following sensor devices: High Frequency Current Transformer, capacitive coupler, antenna sensor, electromagnetic sensor. The first detector 3 and the second detector 4 shown in FIG. 1 are, as an example, active electromagnetic sensors.

As an example, the first detector 3 and the second detector 4 show a respective bandwidth B comprised between 1 MHz and 100 MHz. Preferably, the bandwidth B is comprised between 5 MHz and 25 MHz. In accordance with a particular embodiment, the first detector 3 and the second detector 4 can be implemented by an electrical field sensor as described in the patent application PCT/EP2014/060141. This electrical field sensor comprises a first conductive electrode and a second conductive electrode (not shown). The electrodes are made, by way of example, by respective conductive sheets, such as metal sheets having, as an example, a thickness lower than 0.05 mm, preferably comprised between 0.01 mm and 0.05 mm. According to an example, both first and second electrodes of the electrical field sensor have flat rectangular or quadrangular shapes.

As shown in FIG. 1 the first detector 3 and the second detector 4 are placed in such a way to detect electromagnetic impulsive signals from distinct areas of the electrical object 1. Particularly, the first detector 3 is placed in contact or in proximity to a first area 9 of a section of the first cable 7 entering the cable joint 6 and the second detector 4 is placed in contact or in proximity to a second area 10 of a section of the second cable 8 exiting the cable joint 6: with this arrangement the cable joint 6 is comprised between the first area 9 and the second area 10 and the first detector 3 and the second detector 4 are near to the cable joint 6. In this example, the first area 9 and the second area 10 correspond to ports of the electrical component to be monitored, i.e. an input port and an output port of the cable joint 6.

As an example, if the electrical object 1 is a cable termination, the first area 9 can be an input port where the cable enters the termination and the second area 10 can be a ground connection or a bus bar. In accordance with another embodiment, if the electrical object 1 is three-phase machine (a transformer, a motor or generator) one of the three-phase inputs (or outputs) and the ground connection can be used as first area 9 and second area 10. Also Gas Insulated Switchgears show several ports to be used as first and second areas 9 and 10 to arrange the first detector 3 and the second detector 4. It is noticed that in some cases more than two detectors can be used. As an example, in order to monitor three-phase machines one detector per phase can be employed in order to monitor each phase separately.

The first detector 3 is connected to a first input 11 of the signal processing module 5 by a first signal cable 12 and the second detector 4 is connected to a second input 13 of the signal processing module 5 by a second signal cable 14. Preferably, the first signal cable 12 and the second signal cable 14 are of the same length which is comprised in the range 1 m-50 m, particularly 1 m-10 m, but in special cases the signal cables can be long up to 1 km (e.g. for monitoring submarine cable segments and joints).

The signal processing module 5 is structured to receive electric signals from the first detector 3 and the second detector 4 and processing them in order to associate the detected signals to partial discharge pulses generated inside the cable joint 6 between the first and second areas 9 and 10 or to a noise signal generated outside first and second areas 9 and 10.

The partial discharge detection apparatus 2 can include a power supply module configured to provide electrical power to the signal processing module 5. The power supply module can include a battery, a power adaptor connected to a low voltage Grid or preferably a magnetic energy harvester 15, as shown in FIG. 1. The magnetic energy harvester 15 is a magnetic coil (operating as a current transformer) that extracts electrical energy from the first cable 7 and transmits it to the signal processing module 5 via a supply cable 16. In accordance with an embodiment, the magnetic energy harvester 15 and the signal processing module 5 can be integrated together to form a single device to be permanently installed or even integrated on the electrical object 1: as an example, this solution is preferable for monitoring of HV and MV cable joints.

In accordance with a preferred embodiment the magnetic energy harvester 15 is a current transformer and comprises a toroid of ferromagnetic material clamped on the first cable 7 or on the second cable 8. The toroid has about 100 coils and is able to generate a voltage from 3V to 20V when a current of about 50 A to 1000 A flows in the electrical object 1. The generated voltage is rectified and regulated by specific power supply circuit (not shown). As an example, the power consumption of the signal processing module 5 is less than 100 mW average, the greatest part being for the communication interface (that has peaks of 2 W when active).

Figure 2:
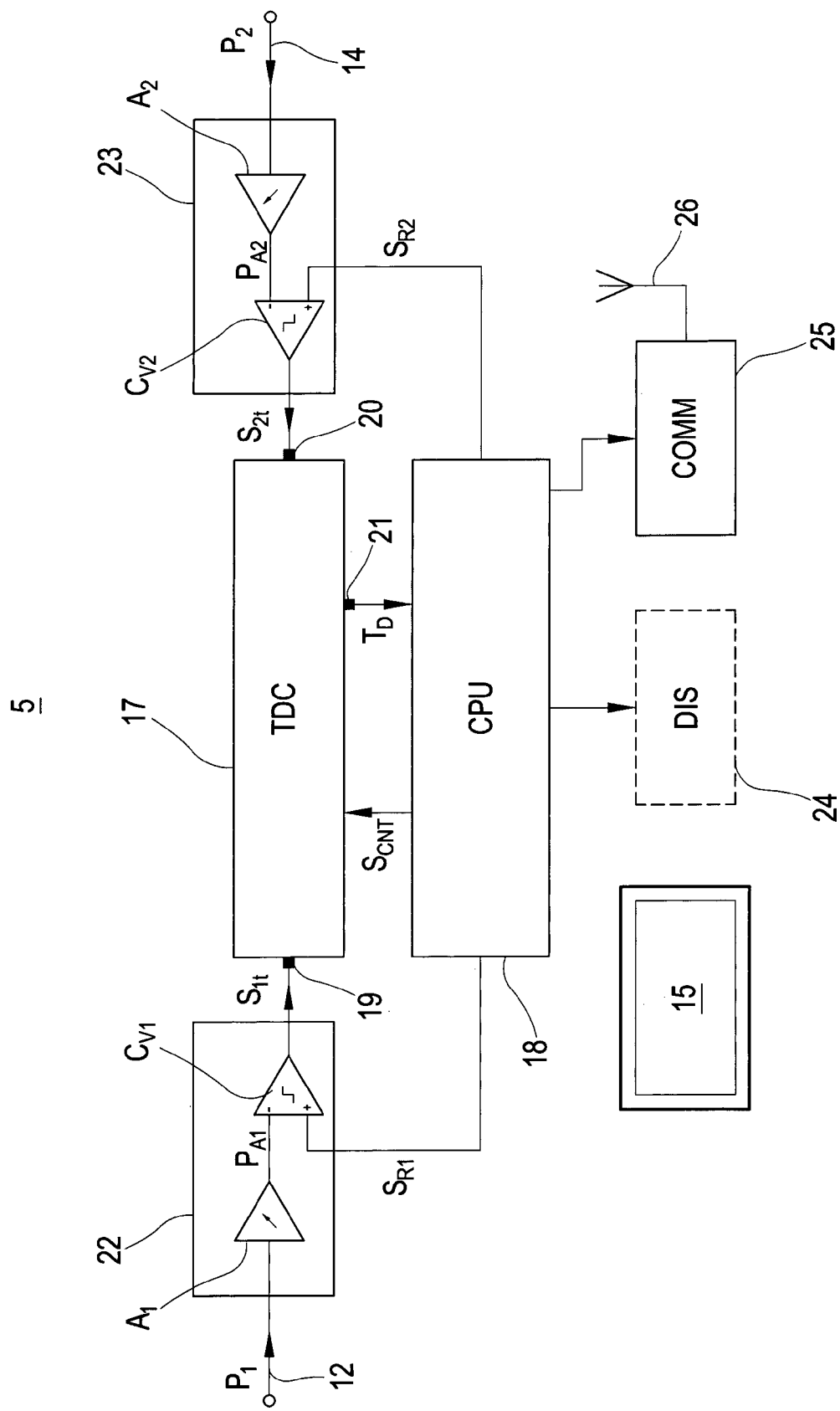
FIG. 2 shows an example of a signal processing module employable by said partial discharge detection apparatus.

FIG. 2 shows a particular embodiment of the signal processing module 5 comprising a time calculation module 17 and a control and processing module 18. The time calculation module 17 is configured to measure, from electrical pulses detected by the first and second detectors 3 and 4, at respective first and second detection events, a time interval $T_D$ comprised between the first and second detection events. The control and processing module 18 is configured to compare the measured time interval $T_D$ with at least one time threshold value $TH_t$ to associate the detected electrical pulses to partial discharge pulses or to noise. Possible levels among which the time threshold value $TH_t$ is set are disclosed in detail in the following description with reference to the example shown in FIG. 6.

Particularly, the time calculation module 17 is provided with a third input 19 connected to the first signal cable 12 and a fourth input 20 connected to the second signal cable 14. The time calculation module 17 includes a Time-to-Digital Converter (TDC) circuit, which is structured to measure the time interval comprised between an arrival time of an electrical signal received at the third input 19 (or the fourth input 20) and another arrival time of another electrical signal received at the fourth input 20 (or third input 19). As an example, the TDC circuit 17 is configured to measure the time interval by performing a time counting triggered by an initial signal received at one of its inputs and stopped by the subsequent received signal. The time calculation module 17 can be implemented by a commercially available TDC integrated circuit or in a FPGA (Field Programmable Gate Array). The TDC circuit 17 is configured to provide on an first output 21 an output signal representing the measured time interval $T_D$ under the form of a digital value.

Preferably, the employed TDC circuit 17 shows a resolution comprised between 0.01 ns and 10 ns, more preferably the resolution is comprised between 0.01 ns and 1 ns; still more preferably the resolution is in the range 0.01 ns-0.5 ns. In accordance with an example, the TDC circuit 17 shows a maximum counting interval of 5 μs with no deadtime and a counting resolution of about 16 bit. For specific applications, where a maximum range lower than 100 ns is expected (e.g. for very short electrical components to be monitored), a counting resolution also lower than 8 bit may be employed.

The control and processing module 18 is configured to receive the signal representing the measured time interval $T_D$ and compare it with the time threshold $TH_t$ to determine if partial discharges or noise have been detected. The time threshold $TH_t$ corresponds to a propagation time employed by an electrical pulse generated at the first area 9 and propagating along the cable joint 6 to reach the second area 10 (or vice versa). The value of the time threshold $TH_t$ can be evaluated theoretically or can be measured experimentally by employing the first and the second detectors 3 and 4.

According to the results of the comparing step, the control and processing module 18 is configured to associate a detected electromagnetic impulsive signal to partial discharge pulses generated inside the cable joint 6, between the first and second areas 9 and 10, if the measured time interval $T_D$ is lower than the time threshold $TH_t$. On the contrary, if the measured time interval $T_D$ is equal/greater to/than said time threshold $TH_t$, the control and processing module 18 associates the detected electromagnetic impulsive signal to a noise signal generated outside the cable joint 6.

Moreover, the control and processing module 18 is configured to generate control signals $S_{CNT}$ to be transmitted to the time calculation module 17. As an example, the control signals $S_{CNT}$ may include interrogation signals with which the control and processing module 18 triggers a time measure to be performed by the time calculation module 17. As an example, the control and processing module 18 is configured to require measured data from the time calculation module 17 at the end of measure windows of 10ρs. The control and processing module 18 can include a Control and Processing Unit (CPU) and is provided with a memory module (not shown) to store digital values representing the results of the comparing step with the time threshold $TH_t$. As an example, the control and processing module 18 is implemented by means of a microcontroller.

In accordance with the example shown in FIG. 2 the signal processing module 5 further comprises a first conversion module 22 and a second conversion module 23. The first conversion module 22 is structured to generate from a first electrical pulse $P_1$ provided by the first detector 3 a first time signal $S_{1t}$ to be sent to the time calculation module 17 to indicate that a first detection event is occurred in the first detector 3. The second conversion module 23 is structured to generate from a second electric pulse P2 provided by the second detector 4 a second time signal $S_{2t}$ to be sent to the time calculation module 17 to indicate that a second detection event is occurred in the second detector 4.

Particularly, the first conversion module 22 includes a first voltage comparator $C_{V1}$ and the second conversion module 23 includes a second voltage comparator $C_{V2}$ to perform comparing with a voltage threshold $TH_V$. In accordance with a particular embodiment, the first conversion module 22 further comprises a first voltage amplifier A1 structured to amplify the first electrical pulse $P_1$ and provide a first amplified electrical pulse $P_{A1}$ to the first voltage comparator $C_{V1}$. The first voltage comparator $C_{V1}$ is configured to compare the first amplified electrical pulse $P_{A1}$ with the voltage threshold $TH_V$ and provide the first time signal $S_{t1}$ representing a first logical level (e.g. the bit 1) if the voltage of the first amplified electrical pulse $P_{A1}$ is greater than the voltage threshold $TH_V$, or a second logical level (i.e. the bit 0) if the voltage of the first amplified electrical pulse $P_{A1}$ is equal/lower to/than the voltage threshold $TH_V$. The first voltage comparator $C_{V1}$ and the second voltage comparator $C_{V2}$ can be realized, preferably, by corresponding fast comparators. Typically, a fast comparator is a voltage comparator having propagation times lower than, preferably, 5 ns e output times lower than, preferably, 1 ns.

The second conversion module 23 further comprises a second voltage amplifier A2 structured to amplify the second electrical pulse P2 and provide a second amplified electrical pulse $P_{A2}$ to the second voltage comparator $C_{V2}$. The second voltage comparator $C_{V2}$ is configured to compare the second amplified electrical pulse $P_{A2}$ with the voltage threshold $TH_V$ and provide the second time signal $S_{t2}$ representing the second logical level (e.g. the bit 1) if the voltage of the second amplified electrical pulse $P_{A2}$ is greater than the voltage threshold $TH_V$, or the second logical level (i.e. the bit 0) if the voltage of the second amplified electrical pulse $P_{A2}$ is equal/lower to/than the voltage threshold $TH_V$.

According to further examples, the first and second conversion module 22 and 23 can be respectively included into the first detector 3 and the second detector 4 or can be both included into the signal processing module 5. According to the described example, the first and the second conversion modules 22 and 23 have the function of converting the electrical pulses coming from the first and second detectors 3 and 4 in binary signals suitable to trigger and stop the time computing performed by the time calculation module 17. Moreover, the first and second voltage comparators $C_{V1}$ and $C_{V2}$ allows rejecting electrical pulses having low amplitude and so more probably due to external noise, so showing also a filtering function.

The control and processing module 18 is configured to generate a first regulation signal $S_{R1}$ and a second regulation signal $S_{R2}$ to be provided to the first voltage comparator $C_{V1}$ and the second comparator $C_{V2}$ in order to set the voltage threshold $TH_V$. Particularly, the first and second regulation signals $S_{R1}$ and $S_{R2}$ can be fed to respective negative terminals of the first voltage comparator $C_{V1}$ and the second comparator $C_{V2}$ while the first and second amplified electrical pulse $P_{A1}$ and $P_{A2}$ can be supplied to positive terminals of the corresponding first voltage comparator $C_{V1}$ and second comparator $C_{V2}$.

According to a particular example, the signal processing module 5 is further provided with a display device 24 and/or a communication device 25. The display device 24 is configured to provide a visual feedback to the user about the state of the monitored cable joint 6. The display device 24 can be a LED (Light Emitting Diode) array indicating the detected situation (e.g. normal, warning or alarm), or in an LCD (Liquid-Crystal Display) displaying the collected data. The communication device 25 is configured to transmit the collected data to a remote monitoring station (not shown). The communication device 25 is preferably a wireless device (provided with an antenna 26), such as a local Radio Frequency interface (as an example, possible technologies are: Bluetooth, WiFi, LoRa) or a mobile service modem, such as GSM, 3G or LTE modem. According to another embodiment, the communication device 25 employs a wired interface, such as a wired line, e.g. operating according to the standard RS-485, including copper wires or optical fibers. It is observed that, in some embodiments, the magnetic energy harvester 15 and the communication device 25 can be integrated together to form a single device that can be permanently installed or even integrated on the electrical component object 1: as an example, this solution is well suited for monitoring HV and MV cable joints.

An example of a method for processing partial discharge signal, which can employ the partial discharge detection apparatus 2 above illustrated, is described herein below. Numerical values are provided for sake of clarity and in non-limitative manner.

Figure 3:
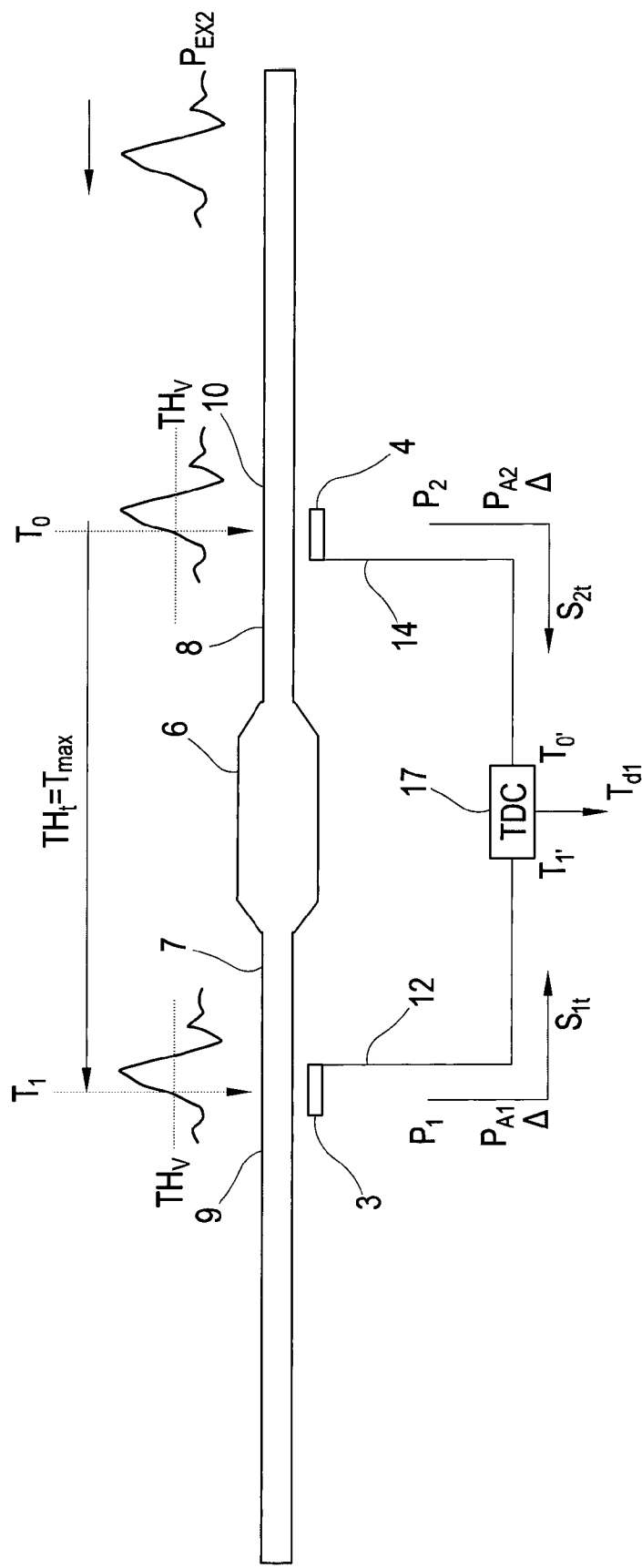
FIG. 3 and FIG. 4 refer to examples of a method for discriminating external noise from partial discharges implementable with said partial discharge detection apparatus.

FIG. 3 shows only some of the modules/devices included into the partial discharge detection apparatus 2 and refers to the case in which an external electrical pulse $P_{EX2}$ reaches from outside the measuring section included between the first and second areas 9 and 10. The time threshold $TH_t$ is fixed to a value $T_{max}$ (e.g. $T_{max}$=10 ns) corresponding to the maximum time needed by an electrical pulse to propagate from the first area 9 to the second area 10.

The external electrical pulse $P_{EX2}$ reaches the second detector 4 at time $T_0$ and proceeds along the second cable 8, the cable joint 6 and the first cable 7 with the same propagation velocity. As an example, if the propagation velocity is 189 m/ρs (typical value for a HV cable), and the measuring section is 2 m long, the external electrical pulse $P_{EX2}$ takes about 10 ns (i.e. 1000 2/189) to reach the first sensor 3: the time $T_1$ in which the first detector 3 is reached is, according to the example, $T_1=T_0+10$ ns.

When the second detector 4 receives the external electrical pulse $P_{EX2}$ it generates the second electrical pulse P2 (FIG. 2) which propagates along the second signal cable 14 and is amplified by the second voltage amplifier A2 to produce the second amplified electrical pulse $P_{A2}$. The second voltage comparator $C_{V2}$ compares the second amplified electrical pulse $P_{A2}$ with the voltage threshold $TH_V$. According to the described example the amplitude of the second amplified electrical pulse $P_{A2}$ assumes a value greater than the voltage threshold $TH_V$ and the second voltage comparator $C_{V2}$ generates a second time signal $S_{2t}$ assuming logic level (e.g. 1) suitable to trigger at a time $T_0'$ the time calculation performed by the TDC 17. The time $T_0'$ can be expressed by adding time $T_0$ and a delay Δ (e.g 8 ns): $T_0'=T_0+\Delta$. The delay Δ is given by the propagation time along the second signal cable 14 and other terms such as an example: intrinsic response delay of the second detector 4 and tolerance on the actual length of the second signal cable 14.

The first detector 3 receives the external electrical pulse $P_{EX2}$ at a time $T_1$ and generates the first electrical pulse P1 (FIG. 2) which propagates along the first signal cable 12 and is amplified by the first voltage amplifier A1 to produce the first amplified electrical pulse $P_{A1}$. The first voltage comparator $C_{V1}$ compares the first amplified electrical pulse $P_{A1}$ with the voltage threshold $TH_V$. According to the described example the amplitude of the first amplified electrical pulse $P_{A1}$ assumes a value greater than the voltage threshold $TH_V$ and the first voltage comparator $C_{V1}$ generates a first time signal $S_{1t}$ assuming logic level (e.g. 1) suitable to stop the time calculation performed by the TDC 17 at a time $T_1'$.

The time $T_1'$ can be expressed by adding time $T_1$ and the above mentioned delay Δ (e.g. 8 ns): $T_1'=T_1+\Delta$. It is assumed that the delay Δ is the same for propagation along the first signal cable 12 and the second signal cable 14. This first time signal Sir stops at time $T_1'$ the time counting started at the time $T_0'$. The first time signal Sir and the second time signal $S_{2t}$ represent corresponding detection events occurred at the first and second detectors 3 and 4 for less than delay Δ.

The TDC 17 counts the interval $T_{d1}$ comprised between the generation times of first time signal Sir and the second time signal $S_{2t}$:

$$T_{d1}=T_1'-T_0'=(T_1+\Delta)-(T_0+8 \text{ ns})=(T_0+10 \text{ ns}+\Delta)-(T_0+8 \text{ ns})=10 \text{ ns} \quad (1)$$

and provides the corresponding digital value $T_{d1}$ to the control and processing module 18. The control and processing module 18 compares the measured time interval $T_{d1}$ with the time threshold $T_{max}$=10 ns and determines that the measured time interval $T_{d1}$ is equal to the time threshold $T_{max}$ and consequently associates the external electrical pulse $P_{EX2}$ to a noise signal since it results to be generated outside the measuring section comprised between the first area 9 and the second area 10. It is noticed again that the term noise may also refer to signals due to partial discharge phenomena occurred inside the electrical object 1 but outside the measuring section comprised between the first area 9 and the second area 10.

It is observed that delay Δ introduced by the signal cables 12 and 14 is canceled out if the signal cables have the same length, as clear from expression (1). Even if the signal cables 12 and 14 shown different lengths the result would have been a fixed time offset that does not modify the subsequent detection algorithm.

Figure 4:
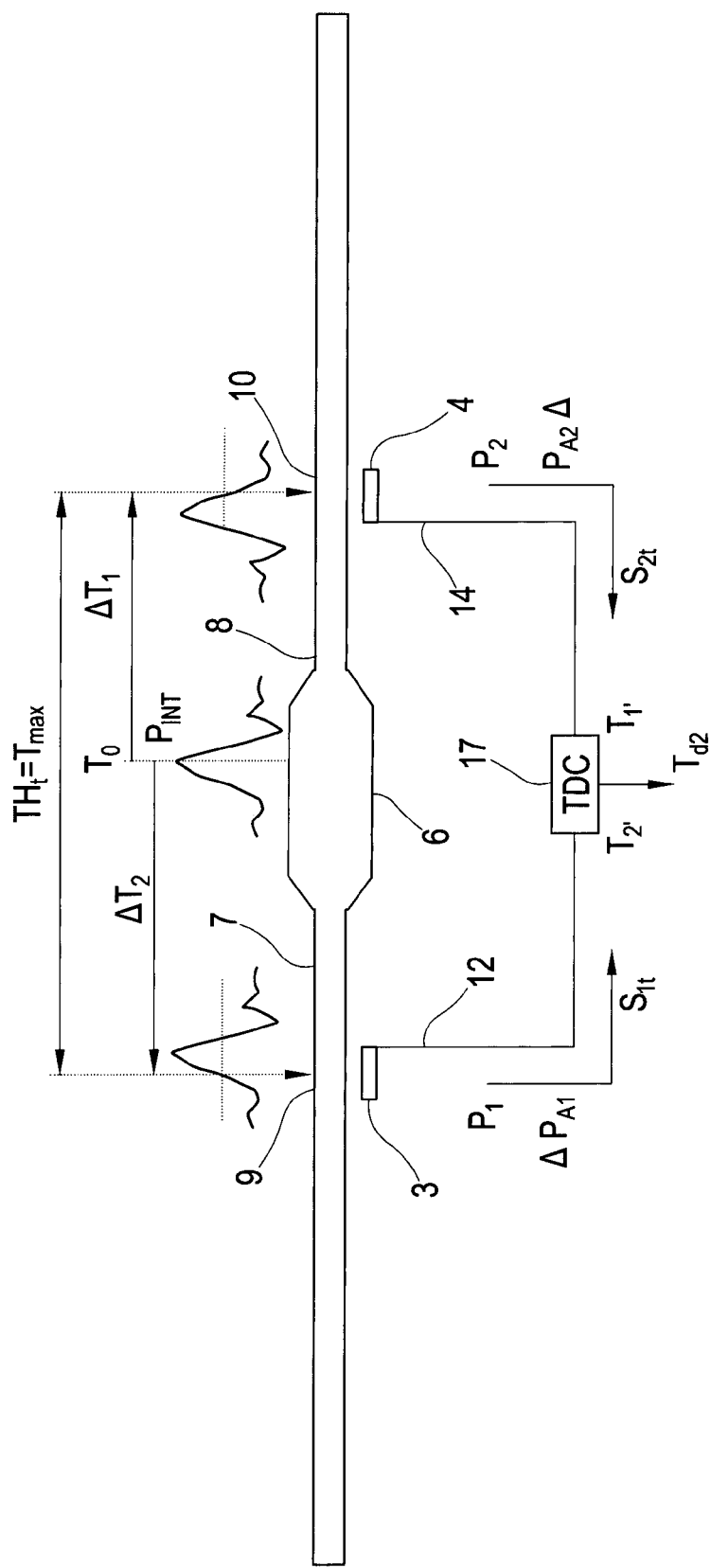

FIG. 4 refers to the case in which an internal electrical pulse $P_{INT}$ is generated at time $T_0$ inside the cable joint 6 (e.g. slightly on the left). The pulse $P_{INT}$ propagates in both directions and is received by the second detector 4 after a time period $\Delta T_1$ (e.g. 3 ns) and by the first detector 3 after a time period $\Delta T_2$ (e.g. 7 ns), assuming the same distance and propagation velocity. The first conversion module 22 and the second conversion module 23 operate in a manner analogous to the one illustrated above with reference to FIG. 3. Also in this case there is a delay of Δ (e.g. 8 ns) in the first and second signal cables 12 and 14 and the second time signal $S_{t2}$ reaches the TDC 17 at time $T_1'$ so triggering the time counting. The first time signal $S_{t1}$ reaches the TDC 17 at time $T_2'$ so stopping of the time counting.

The time counting starts at the $T_1'$:

$$T_1'=T_0+\Delta T_1+\Delta \quad (2)$$

and is stopped at time $T_2'$:

$$T_2'=T_0+\Delta T_2+\Delta \quad (3)$$

The TDC 17 counts the interval $T_{d2}$ comprised between the generation times of first time signal $S_{1t}$ and the second time signal $S_{2t}$:

$$T_{d2}=T_2'-T_1'=(T_0+\Delta T_1+\Delta)-(T_0+\Delta T_2+\Delta)=(T_0+7 \text{ ns}+\Delta)-(T_0+3 \text{ ns})=7 \text{ ns}-3 \text{ ns}=4 \text{ ns} \quad (4)$$

The TDC 17 provides the corresponding digital value $T_{d2}$ to the control and processing module 18. The control and processing module 18 compares the measured time interval $T_{d2}$ with the time threshold $T_{max}$=10 ns and determines that the measured time interval $T_{d2}$ is lower than the time threshold $T_{max}$ and consequently associates the internal electrical pulse $P_{INT}$ to a partial discharge signals generated inside the measuring section comprised between the first area 9 and the second area 10, and particularly, inside the cable joint 6.

It is observed that according to the above description, the discrimination between electrical pulses associated with partial discharge signals generated inside the measuring section and electrical pulses associated with noise is performed on the basis the pulse arrival times and the analysis or the detection of the pulse shape (i.e. the waveform) can be omitted.

Figure 5:
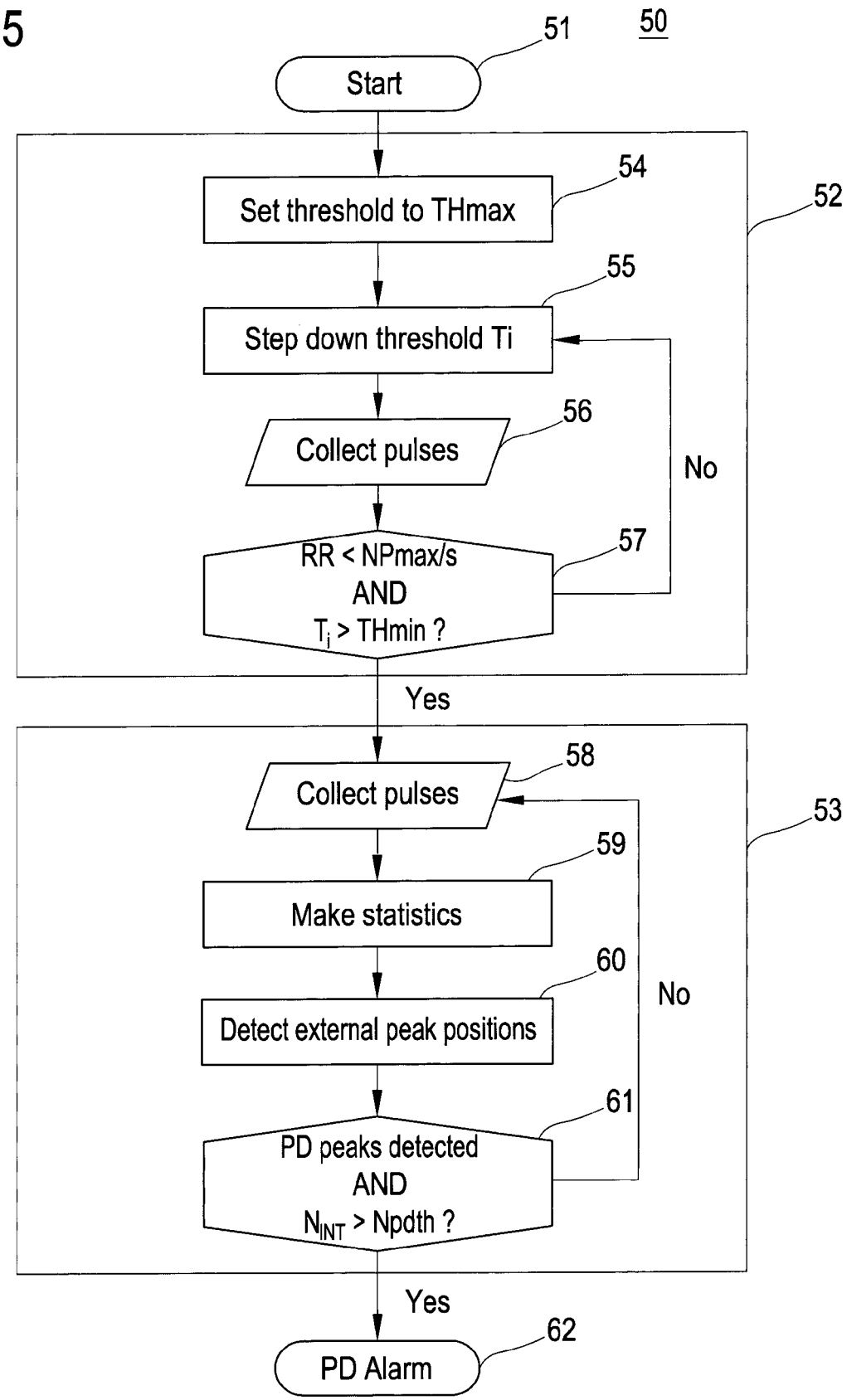
FIG. 5 schematically shows a flowchart of a particular partial discharge detection and alarm generation method.

FIG. 5 shows a flow chart representing a particular embodiment of a partial discharge detection and alarm generation method 50 implementable by the partial discharge detection apparatus 2 and comprising, after a symbolic starting step 51, a pulse threshold setting step 52 and a measure and analysis step 53.

In the pulse threshold setting step 52 the voltage threshold $TH_V$ of the first and second voltage comparators $C_{V1}$ and $C_{V2}$ is determined. It is observed that a proper determination of the voltage threshold $TH_V$ allows optimizing sensitivity and performances. Since application conditions can vary greatly from one installation to another, the pulse threshold setting step 52 can be implemented by an automatic algorithm running on the control and processing module 18.

Figure 6:
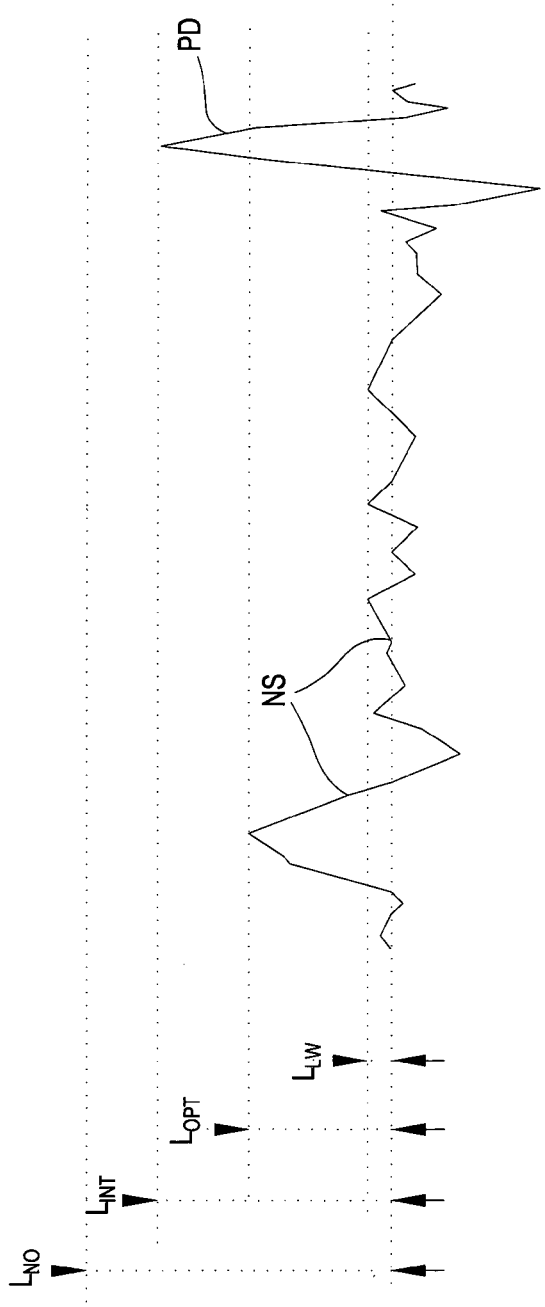
FIG. 6 shows several possible levels among which a voltage threshold can be selected.

FIG. 6 shows a situation that allows describing an example of the approach that can be used to determine the voltage threshold THY. In FIG. 6 an exemplary trend of impulsive signals PD and NS have been shown together with several threshold levels: $L_{NO}$, $L_{INT}$, $L_{OPT}$, $L_{LW}$. As clear from FIG. 6, if the threshold is set to a very high level $L_{NO}$, no signal will overcome it, so no pulses can be detected. Decreasing the threshold voltage at an intermediate level $L_{INT}$ some pulses may be crossed, either from external sources (noise) either from PD (in some case the PD level is higher than external pulses, in other cases the opposite). If the threshold is set at a low level $L_{LW}$ the noise causes very frequent and random hits, so it is not possible to detect pulses anymore. It has to be noted that usually external signals are pulse-shaped interferences that has a certain repetition frequency. Noise NS is instead a continuous random signal due to interferences, electronic noise or other physical phenomena. The optimal threshold can be set at a level $L_{OPT}$ which is preferably higher than the noise level $L_{LW}$. As an example the pulse level ranges from 5 mV to 0.5V, the noise level is under 5 mV while the no signal level is higher than 0.5V/1V (this is however strongly dependent from the type of sensors employed).

It is noticed that for setting the optimal voltage threshold the measure of pulses repetition rate can be employed. Particularly, the applicant experimentally observed that real PD pulses have a known repetition rate ranging from about 10 to 1.000 per second, external pulses usually have a higher repetition rate, in the order of 100 to 10.000 pulses per second and noise instead can continuously trigger the partial discharge detection apparatus 2 saturating its detection capability (more than 100.000 pulses per second). These experimental data allow locating the optimal voltage threshold level.

The pulse threshold setting step 52 includes a first setting step 54 in which the voltage threshold value is set to the maximum value THmax as a starting condition, this value can be between 1V and 5V as an example. Then the pulse threshold setting step 52 further comprises the following steps: a decreasing step 55 (i.e. step down the voltage threshold), a first pulse collecting step 56 and a repetition measuring step 57 wherein a pulse repetition rate RR is computed.

In the decreasing step 55 voltage threshold value is progressively decreased, so defining a current voltage threshold THi. The first pulse collecting step 56 is performed by counting the number N of pulses detected by both the first detector 3 and the second detector 4 for which a time interval $T_D$ has been provided, independently on the value of said time interval $T_D$. Moreover, from the counted number of pulses N a repetition rate RR is obtained, as ratio between the number N of pulses and the collection time period.

The pulse threshold setting step 52 further comprises a pulse number comparing step 57 wherein the repetition rate RR is compared with a maximum value NPmax and the current voltage threshold value THi is compared with a minimum voltage value THmin. If the repetition rate RR does not reach the maximum value NPmax and the variable voltage threshold value does not reach the minimum voltage threshold value THmin, the decreasing step 55 and the first pulse collecting step 56 are iteratively carried out. If the repetition rate RR reaches the maximum value NPmax or the variable voltage threshold value THi reaches the minimum voltage threshold value THmin, the current value of the voltage threshold THi is selected as final voltage threshold $TH_V$ to be used in the subsequent measure and analysis step 53.

The maximum value NPmax of the repetition rate can be chosen, as an example, in the range 5.000 to 10.000 pulses per second. The minimum voltage threshold value THmin can be chosen as the minimum value that prevents entering in the noise region: it may range from 3 to 5 mV, as an example.

The measure and analysis step 53 comprises a second pulse collecting step 58 in which the partial discharge detection apparatus 2 performs several detections of electrical pulses by computing the time intervals $T_D$ as above described with reference to expressions (1)-(4) and FIG. 3 and FIG. 4. In the second pulse collecting step 58 the control and processing module 18 stores the data resulting from the detections of the pulses in order to employ these data for a statistic analysis on which the alarm generation can be based.

Figure 7:
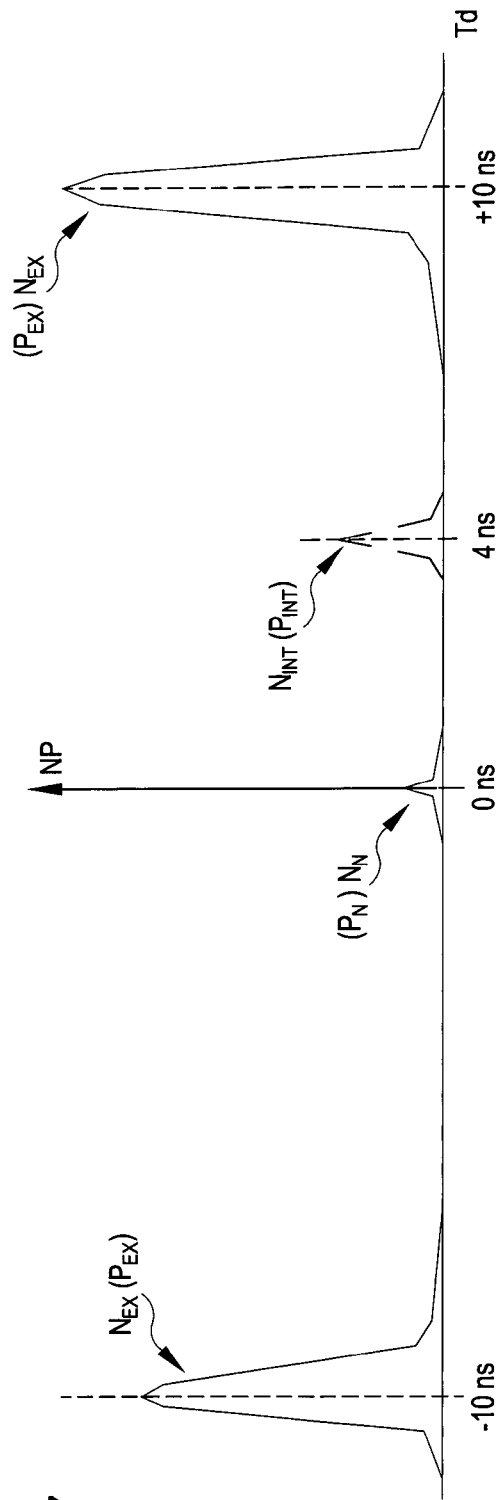
FIG. 7 shows as an example the distribution of detected pulses among different pulse typologies.

Particularly, in a statistic performing step 59, the data of the detected pulses are grouped according to the distribution pulse number on the time interval $T_D$. FIG. 7 shows, as an example, a possible statistic distribution on the time interval $T_D$ of the pulse number $N_P$ among four typologies of pulses: external pulses $P_{EX}$ (having a number of external pulses: $N_{EX}$) radiated or intrinsic noise $P_N$ (number of noise pulses: $N_N$), internal pulses $P_{INT}$ (number of internal pulses: $N_{INT}$).

In accordance with the example of FIG. 7, the external pulses $P_{EX}$, coming from outside the measuring section and from both directions, shows the largest number of detections $N_{EX}$. So the recorded time intervals will be in most cases the maximum value (Tmax or -Tmax, depending on the direction of arrival) substantially corresponding to the time threshold $TH_t$. The small number $N_N$ of recorded time intervals, close to zero, refers to noise pulses $P_N$ radiated by nearby sources that arrive to both first and second detectors 3 and 4. In case of real PD pulses $P_{INT}$, the partial discharge detection apparatus 2 detects a constant time interval falling between the time threshold Tmax and zero.

The pulse time distribution shown in FIG. 7 allows locating the points of interest. It is noticed that since the time location of the pulse numbers $N_{EX}$, $N_N$ internal $N_{INT}$ can be easily and uniquely determined, the control and processing module 18 can automatically learn the time threshold Tmax, without the need of providing a pre-established value or performing a calibration procedure.

The control and processing module 18 performs a peak searching step 60 in which it searches internal peaks $N_{INT}$ located between the external peaks $N_{EX}$. The peak detecting step 60 corresponds to compare the computed time interval value $T_D$ with the time threshold Tmax. If an internal peak is found (i.e. partial discharge signals are recognized) its amplitude $N_{INT}$ is evaluated by the control and processing module 18 in a peak comparison step 61. In the peak comparison step 61 the control and processing module 18 compares the number of the detected pulses resulting from the comparison with the time threshold Tmax with a fixed limit Npdth to asses if such detected pulses can be associated to partial discharge signals generated in the measure section or to noise.

Particularly, in the peak comparison step 61 the control and processing module 18 compares the height of the found peak $N_{INT}$ with the fixed limit Npdth (as an example, Npdth=100-200 for every second of measure). If the peak $N_{INT}$ is greater the fixed limit Npdth an alarm is triggered in an alarm generation step 62. The measure and analysis step 53 is continuously repeated, in order to confirm or update the alarm state. It is observed that for the peak $N_N$, which is located between the external peaks $N_{EX}$, the peak comparison step 61 allows to avoid alarm generation since $N_N$ is lower than fixed limit Npdth.

By correlating the final voltage threshold $TH_V$ with the repetition rate RR and the presence of a peak on the statistic distribution it is possible to estimate the pulse amplitude without actually measuring it. In fact if a small change in the voltage threshold generates a variation on the repetition rate RR, it means that there are pulses of about that height. The nature of these pulses (external, PDs or radiated) can be recognized from the peak position on the statistic graph as depicted in FIG. 7. It further observed that all these information are obtained only from the pulse timings and not from the pulse shapes.

The method for discriminating partial discharges from noise could be also used as a noise filtering technique, to be followed by an acquisition of the partial discharge filtered pulses on which a full analysis of electrical features can be carried out.

The partial discharge detection apparatus 2 allows discrimination of the partial discharges from noise in a non-complex manner. Moreover, since the discrimination method of the invention does not employ the phase signal associated with the voltage supply it can be effectively used for monitoring partial discharges in DC components.

The invention claimed is:

1. An apparatus, comprising:
a first detector configured to detect an electromagnetic impulsive signal from a first area associated with an electrical object and generate a first electrical pulse representing a first detection event of the electromagnetic impulsive signal;
a second detector configured to detect an electromagnetic impulsive signal from a second area associated with the electrical object and generate a second electrical pulse associated with a second detection event of the electromagnetic impulsive signal;
a time calculation module configured to determine a time interval between the first detection event and the second detection event;
a processing module connected to the time calculation module configured to:
compare the measured time interval with a time threshold value;
determine that the electromagnetic impulsive signal is associated to partial discharge pulses generated inside the electrical object between the first and second areas if the measured time interval is lower than the time threshold value; and
determine that the electromagnetic impulsive signal is associated to a noise signal generated outside the electrical object if the measured time interval is equal to or greater than said time threshold value;
a first conversion device configured to receive the first electrical pulse and generate a first time signal at a first detection time;
a second conversion device configured to receive the second electrical pulse and generate a second time signal at a second detection time;
wherein:
the time calculation module is configured to determine the time interval based on the first and second detection times;
the first conversion device includes a first voltage comparator structured to:
compare the first electrical pulse with a voltage threshold, and generate the first time signal having:
a first logical level if a voltage of the first electrical pulse is greater than the voltage threshold, and
a second logical level if the voltage of the first electrical pulse is one of equal to or lower than the voltage threshold; and
the second conversion device includes a second voltage comparator structured to:
compare the second electrical pulse with the voltage threshold, and
generate the second time signal having:
the first logical level if a voltage of the second electrical pulse is greater than the voltage threshold, and
the second logical level if the voltage of the second electrical pulse is equal to or lower than the voltage threshold.

2. The apparatus of claim 1, wherein said first and second voltage comparators each have a propagation time lower than 5 ns and an output time lower than 1 ns.

3. The apparatus of claim 1, wherein each of said first and second detectors includes one or more of the following sensor devices: high frequency current transformer, capacitive coupler, antenna sensor, electromagnetic sensor.

4. The apparatus of claim 1, wherein each of the said first and second detectors is an active electromagnetic sensor having a frequency response from 5 MHz to 20 MHz.

5. The apparatus of claim 1, wherein the processing module is configured to:
count a number of a plurality of electromagnetic impulsive signals having a corresponding measured time interval lower than the time threshold value;
compare said number with a reference value.

6. The apparatus of claim 1, wherein the time calculation module comprises a time-to-digital-converter circuit and is configured to generate said time interval in a form of a digital value.

7. The apparatus of claim 1, wherein the time calculation module includes a time-to-digital-converter circuit configured to:
start computing of the time interval when the first time signal is received by the time-to-digital-converter circuit;

stop computing of the time interval when the second time signal is received by the time-to-digital-converter circuit.

8. The apparatus of claim 7, wherein the time-to-digital-converter circuit comprises a first input port for receiving said first time signal and a second input port for receiving said second time signal.

9. The apparatus of claim 8, wherein the time-to-digital-converter circuit includes a time resolution ranging between 0.01 ns and 10 ns.

10. The apparatus of claim 1, further comprising:
a storage module connected to the processing module and configured to store, if the measured time interval is lower than the threshold value, a detection digital value representing that partial discharge pulses have been detected.

11. The apparatus of claim 1, wherein the time calculation module is configured to determine the time interval based on the first and second detection times in response to that the first time signal has the first logic level and the second time signal has the first logic level.

12. A method, the method comprising
detecting an electromagnetic impulsive signal from a first area associated with an electrical object and generating a corresponding first electrical pulse representing a first detection event of the electromagnetic impulsive signal;
generating a first time signal of a first detection time including:
comparing the first electrical pulse with a voltage threshold, and
generating the first time signal having:
a first logical level if a voltage of the first electrical pulse is greater than the voltage threshold, and
a second logical level if the voltage of the first electrical pulse is one of equal to or lower than the voltage threshold;
detecting an electromagnetic impulsive signal from a second area associated with the electrical object and generating a second electrical pulse representing a second detection event of the electromagnetic impulsive signal;
generating a second time signal of a second detection time including:
comparing the second electrical pulse with the voltage threshold, and
generating the second time signal having:
the first logical level if a voltage of the second electrical pulse is greater than the voltage threshold, and
the second logical level if the voltage of the second electrical pulse is one of equal to or lower than the voltage threshold;
determining a time interval between the first detection time and the second detection time;
comparing the determined time interval with a threshold value;
determining that the electromagnetic impulsive signal is associated to a partial discharge pulse generated inside the electrical object between the first and second areas if the determined time interval is lower than the threshold value; and
determining that the electromagnetic impulsive signal is associated to a noise signal if the determined time interval is equal to or greater than the threshold value.

13. The method of claim 12, wherein the electrical object to be monitored is a direct current operating electrical object.

14. The method of claim 12, wherein the determining the time interval between the first detection time and the second detection time is performed in response to that the first time signal has the first logic level and the second time signal has the first logic level.

15. A system, comprising:
a cable system configured to transmitting a direct current signal, the cable system including a first cable portion, a second cable portion and a third portion coupled between the first cable portion and the second cable portion;
a first detector coupled to the first portion of the cable system and configured to detect a first electromagnetic impulse adjacent to the first detector and generate a first detection signal based on the first electromagnetic impulse;
a second detector coupled to the second cable portion of the cable system and configured to detect a second electromagnetic impulse adjacent to the second detector and generate a second detection signal based on the second electromagnetic impulse; and
a control unit coupled to receive the first detection signal from the first detector at a first time point and receive the second detection signal from the second detector at a second time point and configured to determine that the first electromagnetic
impulse and the first electromagnetic impulse are generated in the cable system within a range between the first detector and the second detector at least partially based on a time interval between the first time point and the second time point;
wherein the control unit:
compares the first detection signal with a first voltage threshold;
generates a first time signal having:
a first logical level if a voltage of the first detection signal is greater than the first voltage threshold, and
a second logical level if the voltage of the first detection signal is one of equal to or lower than the first voltage threshold;
compares the second detection signal with a second voltage threshold; and
generates a second time signal having:
the first logical level if a voltage of the second detection signal is greater than the seconds voltage threshold, and
the second logical level if the voltage of the second detection signal is equal to or lower than the second voltage threshold.

16. The system of claim 15, wherein the control unit is configured to determine that the first electromagnetic signal and the first electromagnetic signal are generated in the cable system within a range between the first detector and the second detector at least partially based on that the first time signal has the first logic level and the second time signal has the first logic level.

17. The system of claim 15, wherein the first voltage threshold and the second voltage threshold are dynamically determined by the control unit.

18. The system of claim 15, wherein the third portion is a cable connector connecting the first cable portion and the second cable portion.

* * * * *